US012707727B2

(12) United States Patent
Yu et al.

(10) Patent No.: US 12,707,727 B2
(45) Date of Patent: Aug. 11, 2026

(54) METHOD FOR MANUFACTURING A SOLAR CELL

(71) Applicant: ZHEJIANG JINKO SOLAR CO., LTD., Haining (CN)

(72) Inventors: Linglin Yu, Haining (CN); Yuanfang Zhang, Haining (CN); Zhao Wang, Haining (CN); Jie Yang, Haining (CN); Peiting Zheng, Haining (CN); Xinyu Zhang, Haining (CN)

(73) Assignee: ZHEJIANG JINKO SOLAR CO., LTD., Haining Zhejiang (CN)

(*) Notice: Subject to any disclaimer, the term of this patent is extended or adjusted under 35 U.S.C. 154(b) by 0 days.

(21) Appl. No.: 19/097,776

(22) Filed: Apr. 1, 2025

(65) Prior Publication Data

US 2025/0311448 A1 Oct. 2, 2025

(30) Foreign Application Priority Data

Apr. 1, 2024 (CN) ......................... 202410382926.5

(51) Int. Cl.
*H10F 10/163* (2025.01)
*H10F 71/00* (2025.01)
*H10F 77/124* (2025.01)

(52) U.S. Cl.
CPC ......... *H10F 10/163* (2025.01); *H10F 71/127* (2025.01); *H10F 71/134* (2025.01); *H10F 77/1243* (2025.01)

(58) Field of Classification Search
None
See application file for complete search history.

(56) References Cited

U.S. PATENT DOCUMENTS

2014/0179054 A1 6/2014 Recaman Payo et al.
2022/0059719 A1 2/2022 Yang et al.
(Continued)

FOREIGN PATENT DOCUMENTS

CN 209389044 U 9/2019
CN 115148828 A 10/2022
(Continued)

OTHER PUBLICATIONS

Zhejiang Jinko Solar Co., Ltd., Chinese 1st Examination Report with English Translation, CN202410382926.5, May 15, 2024, 12 pgs.

(Continued)

*Primary Examiner* — Dustin Q Dam
(74) *Attorney, Agent, or Firm* — USCH Law, PC

(57) ABSTRACT

Provided is a method for manufacturing a solar cell, including: providing a substrate having a first surface and a second surface opposite to each other forming a first doped layer on the second surface and concurrently forming a second doped layer on a target doped dielectric layer; patterning the second doped layer, including removing portions of the second doped layer; etching away the portion of the target doped dielectric layer over the first region; etching away a portion of the target doped semiconductor layer over the first region, and etching away a portion of the second doped layer over the second region; and etching away the portion of the target doped dielectric layer over the second region, a portion of the target doped semiconductor layer over the second region being reserved as a doped semiconductor portion. The respective first regions and the respective second regions are alternatingly distributed.

20 Claims, 6 Drawing Sheets

(56) References Cited

U.S. PATENT DOCUMENTS

| | | | |
|---|---|---|---|
| 2023/0197877 | A1 | 6/2023 | Swanson et al. |
| 2024/0088308 | A1 | 3/2024 | Mao et al. |
| 2024/0097060 | A1 | 3/2024 | Lin |

FOREIGN PATENT DOCUMENTS

| | | | |
|---|---|---|---|
| CN | 115411138 | A | 11/2022 |
| CN | 116266616 | A | 6/2023 |
| CN | 116487454 | A | 7/2023 |
| CN | 117374169 | A | 1/2024 |
| CN | 117673176 | A | 3/2024 |
| CN | 117712219 | A | 3/2024 |
| CN | 117747678 | A | 3/2024 |
| DE | 202023101527 | U1 | 5/2023 |
| WO | 2014179368 | A1 | 11/2014 |

OTHER PUBLICATIONS

Zhejiang Jinko Solar Co., Ltd., Chinese Notice of Grant with English Translation, CN202410382926.5, Jul. 1, 2024, 8 pgs.

Zhejiang Jinko Solar Co., Ltd. European Search Report with English Translation, EP25167549.2, Aug. 29, 2025, 5 pgs.

207
201
3
4
3
4
200
202
210
205

METHOD FOR MANUFACTURING A SOLAR CELL

CROSS REFERENCE TO RELATED APPLICATIONS

The present disclosure claims the benefit of priority under the Paris Convention to Chinese Patent Application No. 202410382926.5 filed on Apr. 1, 2024, which is incorporated by reference herein in its entirety.

TECHNICAL FIELD

Embodiments of the present disclosure relate to the field of photovoltaic technology, and more specifically, to a method for manufacturing a solar cell.

BACKGROUND

Photovoltaic power generation refers to converting solar energy into electricity via the photovoltaic effect of semiconductors. For example, tunnel oxide passivated contact (TOPCON) cells have attracted increasing attention due to their superior photoelectric conversion performance.

TOPCON cells utilizes a tunnel oxide passivated contact solar cell technology based on the selective carrier principle. A front side of a TOPCON cell includes an emitter, which forms a PN junction with a substrate. Creating a localized emitter is a critical approach to reducing surface recombination in solar cells. Currently, a laser irradiation process is often used to pattern the initial emitter to form a local emitter. However, the laser irradiation process may cause physical damage to the surface of the base, affecting the performance of the solar cell.

Thus, improvement of existing methods for forming localized emitters is desired.

SUMMARY

The present disclosure provides a method for manufacturing a solar cell, which at least facilitates mitigating damage to the solar cell caused by a laser irradiation process during the manufacture of the solar cell.

According to some embodiments, a first aspect of the present disclosure provides a method for manufacturing a solar cell. The method includes: providing a substrate having a first surface and a second surface opposite to the first surface, a target doped semiconductor layer is formed on the first surface, and a target doped dielectric layer is formed on a surface of the target doped semiconductor layer away from the first surface; concurrently forming a first doped layer on the second surface and forming a second doped layer on a side of the target doped dielectric layer away from the target doped semiconductor layer, where the first doped layer has a doping type different from a doping type of the target doped semiconductor layer; patterning process the second doped layer by removing portions of the second doped layer covering portions of the target doped dielectric layer over respective first regions of the first surface, where patterning the second doped layer includes localized laser irradiation; etching away the portions of the target doped dielectric layer over the respective first regions to expose portions of the target doped semiconductor layer over the respective first regions; etching away the portions of the target doped semiconductor layer over the respective first regions, and etching away portions of the second doped layer over respective second regions of the second regions to expose portions of the target doped dielectric layer over the respective second regions; and etching away the portions of the target doped dielectric layer over the respective second regions, leaving portions of the target doped semiconductor layer over the respective second regions to serve as doped semiconductor portions for the solar cell.

In some embodiments, forming the first doped layer and the second doped layer include: concurrently forming a first intrinsic semiconductor layer on the second surface and forming a second intrinsic semiconductor layer on the side of the target doped dielectric layer away from the target doped semiconductor layer; concurrently forming a first doped dielectric layer on a side of the first intrinsic semiconductor layer away from the substrate, and forming a second doped dielectric layer on a side of the second intrinsic semiconductor layer away from the target doped dielectric layer; and driving a dopant element in the first doped dielectric layer into the first intrinsic semiconductor layer to form a first doped semiconductor layer, and driving a dopant element in the second doped dielectric layer into the second intrinsic semiconductor layer to form a second doped semiconductor layer, where the first doped layer includes the first doped dielectric layer and the first doped semiconductor layer, and the second doped layer includes the second doped dielectric layer and the second doped semiconductor layer. In etching away the portions of the target doped dielectric layer over the respective second region, the first doped dielectric layer is etched away concurrently.

In some embodiments, patterning the second doped layer includes: removing portions of the second doped dielectric layer over the respective first regions and portions of the second doped semiconductor layer over the respective first regions by localized laser irradiation.

In some embodiments, the localized laser irradiation has a power of 25 W to 55 W.

In some embodiments, patterning the second doped layer includes: removing portions of the second doped dielectric layer over the respective first regions by the localized laser irradiation; and etching away portions of the second doped semiconductor layer over the respective first regions by an alkaline solution after removing the portions of the second doped dielectric layer.

In some embodiments, the localized laser irradiation has a power of 10 W to 40 W.

In some embodiments, the alkaline solution is a sodium hydroxide (NaOH) with a mass percentage of 0.5% to 5%, and a process time for removing the portions of the second doped semiconductor layer over the respective first regions is 400 s to 800 s.

In some embodiments, the second doped semiconductor layer has a thickness not less than a thickness of the first doped semiconductor layer.

In some embodiments, in etching away the portions of the target doped dielectric layer over the respective first regions, portions of the second doped dielectric layer over the respective second regions are concurrently etched away; after the portions of the target doped dielectric layer over the respective first regions are etched away, the portions of the target doped semiconductor layer over the respective first regions are etched away, and portions of the second doped semiconductor layer over the respective second region are concurrently etched away to remove the portions of the second doped layer over the respective second regions.

In some embodiments, the portions of the target doped semiconductor layer over the respective first regions are etched away by an alkaline solution to expose the respective first regions of the first surface. After the portions of the target doped semiconductor layer over the respective first regions are etched away, texturing the respective first regions of the first surface is performed by using the alkaline solution.

In some embodiments, process parameters of etching away the portions of the target doped semiconductor layer over the respective first regions includes: the alkaline solution including a sodium hydroxide (NaOH) solution with a mass percentage of 0.5% to 5%, a process temperature being 60° C. to 80° C., and a process time being 100 s to 1000 s.

In some embodiments, the portions of the target doped dielectric layer over the respective second regions are etched away by using an acidic solution. Process parameters of etching away the portions of the target doped dielectric layer over the respective second regions include: the acidic solution including a hydrofluoric acid (HF) solution with a mass percentage of 10% to 70%, and a process time being 50 s to 70 s.

In some embodiments, the second doped layer is a semiconductor material layer doped with a first doping element; after the portions of the target doped dielectric layer over the respective first regions are etched away, the portions of the target doped semiconductor layer over the respective first regions and the portions of the second doped layer over the respective second regions are concurrently etched away.

In some embodiments, the target doped dielectric layer has a thickness of 100 nm to 200 nm.

In some embodiments, the method further includes: forming a first passivation layer, where the first passivation layer is located on a surface of the doped semiconductor portion away from the substrate and over the respective second regions of the first surface; and forming first electrodes, where the first electrodes are in electrical contact with the doped semiconductor portions respectively.

In some embodiments, a tunneling layer is formed on the second surface before the first doped layer is formed, and the tunneling layer has a thickness of no more than 2.5 nm.

In some embodiments, the target doped semiconductor layer has a doping type different from a doping type of the substrate, the target doped semiconductor layer has a doping type same as a doping type of the substrate, and a doping concentration greater than a doping concentration of the substrate.

In some embodiments, forming the target doped semiconductor layer and the target doped dielectric layer includes: providing an initial substrate including a third surface; forming the target doped dielectric layer on the third surface of the initial substrate; and driving a doping element in the target doped dielectric layer into a portion of a thickness of the initial substrate, wherein the portion of the thickness of the initial substrate is converted into the target doped semiconductor layer, and the remaining portion of initial substrate is used as the substrate.

In some embodiments, process parameters of driving the doping element in the target doped dielectric layer into the portion of the thickness of the substrate include: a process temperature being 800° C. to 1200° C., and a process time being 2 h to 5 h.

BRIEF DESCRIPTION OF THE DRAWINGS

One or more embodiments are exemplarily described with reference to the corresponding figures in the accompanying drawings, and the exemplary descriptions are not to be construed as limiting the embodiments. Unless otherwise particularly stated, the figures in the accompanying drawings are not drawn to scale. To describe the technical solutions in the embodiments of the present disclosure or in the conventional technologies more clearly, the following briefly introduces the accompanying drawings required for describing the embodiments. Apparently, the accompanying drawings in the following description show merely some embodiments of the present disclosure, and a person of ordinary skill in the art may still derive other accompanying drawings from these accompanying drawings without creative efforts.

DETAILED DESCRIPTION OF THE EMBODIMENTS

Figure 1:
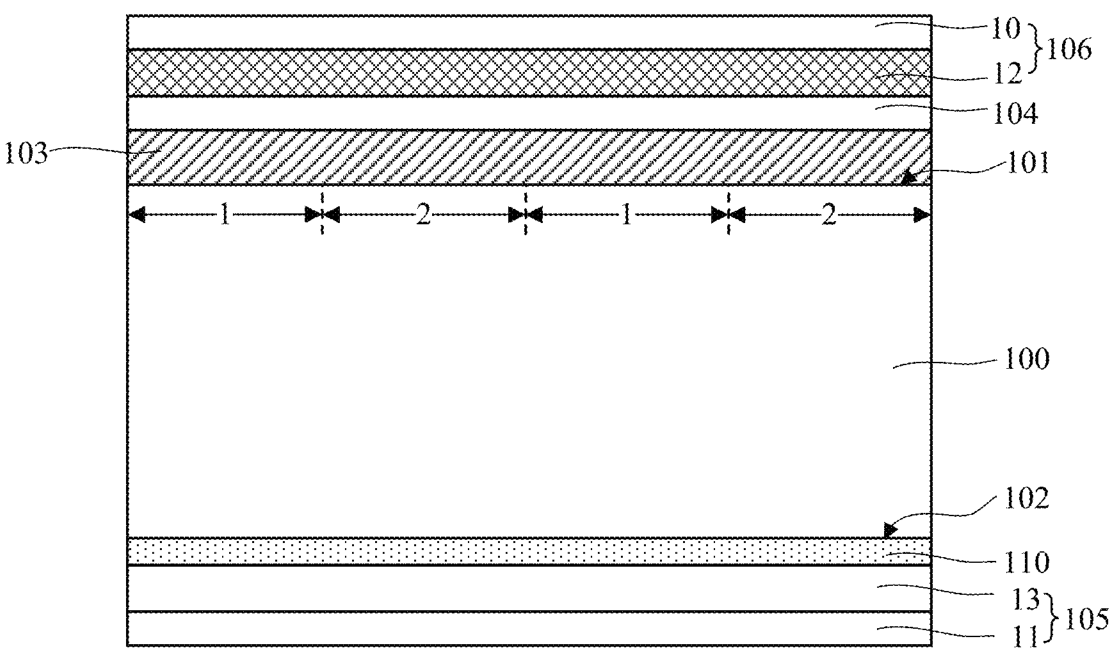
FIG. 1 is a schematic structure diagram corresponding to an operation of providing a substrate in a method for manufacturing a solar cell according to some embodiments of the present disclosure.

As known from the background, improvement of existing methods for forming localized emitters is desired.

In the method for manufacturing a solar cell in the embodiments of the present disclosure, after the target doped semiconductor layer and the target doped dielectric layer are formed on the first surface, the first doped layer is formed on the second surface, and the second doped layer is synchronously formed on the target doped dielectric layer; in the subsequent localized laser irradiation process, the second doped layer can protect the portions of the target doped semiconductor layer and the target doped dielectric layer over the second region, and the portions of the target doped dielectric layer and the target doped semiconductor layer over the first region can reduce the damage caused by the laser to the first region of the substrate; after the patterning process, the portion of the target doped dielectric layer over the first region and the portion of the second doped layer over the second region form a stepped structure, the portion of the target doped dielectric layer over the first region, the portion of the target doped semiconductor layer over the first region, the portion of the second doped layer over the second region, and the portion of the target doped dielectric layer over the second region are sequentially removed, so that in each etching operation performed after the patterning process, the number of film layers over the first region is less than the number of film layers over the second region, so that in the operations of removing film layers over the first region performed after the patterning process, the film layer over the second region that is not included over the first region can be used as a mask for the etching operation, thereby eliminating the need for an operation of forming a mask, which facilitates the reduction of process operations and reduces the process cost.

As used herein, features (e.g., regions, structures, or devices) described as being "adjacent" to one another are intended to include features having one or more disclosed identifications and positioned closest to (e.g., nearest) one another. An additional feature (e.g., an additional region, an additional structure, or an additional device) that does not match the one or more disclosed identifications of the "adjacent" features may be disposed between the "adjacent" features. In other words, the "adjacent" features may be positioned directly adjacent to one another such that no other features intervene between the "adjacent" features; or the "adjacent" features may be positioned indirectly adjacent to one another such that at least one feature having an identification other than the identification associated with at least one of the "adjacent" features is positioned between the "adjacent" features. Thus, features described as being "vertically adjacent" to one another are intended to include features having one or more disclosed identifications positioned vertically closest to (e.g., vertically nearest) one another. Furthermore, features described as being "horizontally adjacent" to one another are intended to include features having one or more disclosed identifications positioned horizontally closest to (e.g., horizontally nearest) one another.

In the following description, a second component formed or disposed above or on a first component, or formed or disposed on a surface of a first component, or formed or disposed on a side of a first component may include some embodiments in which the first component and the second component are in direct contact with each other, and may also include some embodiments in which an additional component may be present between the first component and the second component so that the first component and the second component may not be in direct contact with each other. For simplicity and clarity, various components can be arbitrarily drawn in different proportions. In the drawings, some layers/components can be omitted for simplicity.

Unless specified otherwise, a second component being formed or disposed on a surface of a first component refers to that the first component is in direct contact with the second component.

In the above description, the "component" may refer to a layer, a film, a region, a portion, a structure, etc.

Also, spatially relative terms, such as "beneath," "below," "lower," "above," and "upper," can be used herein for ease of description to describe one element or feature's relationship to another element(s) or feature(s) as illustrated in the figures. Unless otherwise specified, the spatially relative terms are intended to encompass different orientations of a device in use or operation in addition to the orientations depicted in the figures. The device may be otherwise oriented (rotated 90 degrees or at other orientations), which can also be interpreted by the spatially relative descriptors used herein accordingly. In addition, a term "made of" can represents "composed of" and "comprising." Furthermore, one or more additional operations may exist during/between the described operations in a subsequent manufacturing process, and the order of operations may be changed. Also, in the following embodiments, the terms "upper," "over" and/or "above" are defined along a direction of increasing distance from the front surface or the back surface. The materials, configurations, sizes, processes, and/or operations as illustrated in the embodiments can be employed in other embodiments, and detailed descriptions thereof can be omitted.

As used herein, spatially relative terms, such as "beneath," "below," "lower," "bottom," "over," "upper," "top," "front," "behind," "left," and "right," can be used for case of description to describe one element or feature's relationship to another element(s) or feature(s) as illustrated in the figures. Unless otherwise specified, the spatially relative terms are intended to encompass different orientations of the material in use or operation in addition to the orientation depicted in the figures. For example, if the material in the figures is turned over, elements described as "below" or "beneath" or "under" or "bottom" of other elements or features would then be oriented "above" or "top" of the other elements or features. Thus, the term "below" can encompass both an orientation of above and below, depending on the context in which the term is used, which will be obvious to one of ordinary skill in the art. The materials may be otherwise oriented (e.g., rotated 90 degrees, inverted or flipped), which can also be interpreted by the spatially relative descriptors used herein accordingly.

As used herein, the singular forms "a," "an," and "the" are intended to include the plural forms as well, unless the context clearly indicates otherwise.

As used herein, "and/or" includes any and all combinations of one or more of associated listed items.

As used herein, the term "substantially" or "essentially" in reference to a given parameter, property, or condition is intended to include to a degree that the given parameter, property, or condition is met with a degree of deviation (e.g., within an acceptable tolerance), which would be understood by one of ordinary skill in the art. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, "about," "approximately," or "around" in reference to a numerical value of a particular parameter includes the numerical value and a degree of deviation from the numerical value that one of ordinary skill in the art would understand to be within an acceptable tolerance for the particular parameter. For example, "about" or "around" in reference to a numerical value may include additional numerical values that are within a range of 90.0% to 110.0% of the numerical value, such as within a range of 95.0% to 105.0% of the numerical value, within a range of 97.5% to 102.5% of the numerical value, within a range of 99.0% to 101.0% of the numerical value, within a range of 99.5% to 100.5% of the numerical value, or within a range of 99.9% to 100.1% of the numerical value.

As used herein, a "conductive material" is intended to include one or more of the following conductive materials: a metal (e.g., tungsten (W), titanium (Ti), molybdenum (Mo), niobium (Nb), vanadium (V), hafnium (Hf), tantalum (Ta), chromium (Cr), zirconium (Zr), iron (Fc), ruthenium (Ru), osmium (Os), cobalt (Co), rhodium (Rh), iridium (Ir), nickel (Ni), palladium (Pa), platinum (Pt), copper (Cu), silver (Ag), gold (Au), or aluminum (Al)), an alloy (e.g., a Co-based alloy, a Fe-based alloy, a Ni-based alloy, a Fe and Ni-based alloy, a Co and Ni-based alloy, a Fe and Co-based alloy, a Co and Ni and Fe-based alloy, a Al-based alloy, a Cu-based alloy, a Mg-based alloy, a Ti-based alloy, steel, low carbon steel, or stainless steel), a conductive metal-containing material (e.g., a conductive metal nitride, a conductive metal silicide, a conductive metal carbide, or a conductive metal oxide), and a conductively-doped semiconductor material (e.g., a conductively-doped polysilicon, a conductively-doped germanium (Ge), a conductively-doped silicon germanium (SiGe)). In addition, a "conductive structure" is intended to include a structure formed from and including a conductive material.

As used herein, a "insulating material" is intended to include, for example, one or more of the following electrically insulating materials: at least one dielectric oxide material (e.g., one or more of silicon oxide (SiOx), phosphosilicate glass, borosilicate glass, borophosphosilicate glass, fluorosilicate glass, aluminum oxide ($AlO_x$), hafnium oxide ($HfO_x$), niobium oxide ($NbO_x$), titanium oxide ($TiO_x$), zirconium oxide ($ZrO_x$), tantalum oxide ($TaO_x$), and magnesium oxide ($MgO_x$)); at least one dielectric nitride material (e.g., silicon nitride ($SiN_y$)); at least one dielectric oxynitride material (e.g., silicon oxynitride ($SiOxN_y$)); at least one dielectric oxycarbide material (e.g., silicon oxycarbide ($SiO_xC_y$)); at least one hydrogenated dielectric oxycarbide material (e.g., hydrogenated silicon oxycarbide ($SiC_xO_yH_z$)); and at least one dielectric oxycarbonitride material (e.g., silicon oxycarbonitride ($SiO_xC_zN_y$)). A chemical formula herein that includes one or more of "x," "y," and "z" (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represents a material that contains an average ratio of "x" atoms of one element, "y" atoms of another element, and "z" atoms of an additional element (if present) for each atom of the other element (e.g., Si, Al, Hf, Nb, or Ti). Because the chemical formula represent relative atomic ratios rather than a strict chemical structure, the insulating material can include one or more stoichiometric compounds and/or one or more non-stoichiometric compounds, and the values of "x," "y," and "z" (if present) can be integers or can be non-integers. As used herein, the term "non-stoichiometric compound" is intended to include a compound having a composition of a certain element that cannot be expressed by a ratio of well-defined natural numbers and that violates the law of definite proportions. In addition, a "insulating structure" is intended to include a structure formed from and including an insulating material.

Unless the context indicates otherwise, the materials described herein can be formed by any suitable technique, including but not limited to spin coating, blanket coating, chemical vapor deposition (CVD), plasma-enhanced CVD (PECVD), atomic layer deposition (ALD), plasma-enhanced ALD (PEALD), physical vapor deposition (PVD) (e.g., sputtering), or epitaxial growth. The technique used to deposit or grow a particular material can be selected by one of ordinary skill in the art, depending on the particular material to be formed. In addition, unless the context indicates otherwise, material removal described herein can be accomplished by any suitable technique, including but not limited to etching (e.g., dry etching, wet etching, or vapor etching), ion milling, abrasive planarization (e.g., chemical mechanical planarization (CMP)), or an other known method.

The term "semiconductor" used herein may refer to, for example, a layer of material, a substrate, a wafer, or a base, and includes any base semiconductor structure. "Semiconductor" should be understood to include silicon on sapphire (SOS) technology, silicon on insulator (SOI) technology, thin film transistor (TFT) technology, doped and un-doped semiconductors, an epitaxial layer of silicon supported by a base semiconductor structure, as well as other semiconductor structures well known to one skilled in the art. Furthermore, when reference is made to a semiconductor in the following description, previous process operations may have been utilized to form regions/junctions in the base semiconductor structure, and the term semiconductor may include underlying layers containing such regions/junctions.

The following describes the embodiments of the present disclosure in detail with reference to the accompanying drawings. However, a person of ordinary skill in the art may understand that in the embodiments of the present disclosure, many technical details are provided to make readers better understand the embodiments of the present disclosure. However, even without these technical details and various changes and modifications based on the following embodiments, the technical solutions claimed in the embodiments of the present disclosure can be implemented.

FIG. 1 to FIG. 6 are schematic structure diagrams of operations of a method for manufacturing a solar cell according to embodiments of the present disclosure. FIG. 1 is a schematic structure diagram of an operation of providing a substrate in a method for manufacturing a solar cell according to some embodiments of the present disclosure.

Referring to FIG. 1, a substrate 100 is provided. The substrate 100 has a first surface 101 and a second surface 102 opposite to each other. A target doped semiconductor layer 103 is formed on the first surface 101, and a target doped dielectric layer 104 is formed on a surface of the target doped semiconductor layer 103 away from the first surface 101.

The solar cell according to the embodiments of the present disclosure may be a passivated emitter rear cell (PERC), a tunnel oxide passivated contact cell, or the like, which is only an example and is not specifically limited.

The substrate 100 is configured to receive incident light and generate photo-generated carriers. In some embodiments, the substrate 100 may be a semiconductor substrate.

In some embodiments, the material of the substrate 100 may be an elemental semiconductor material. Specifically, the elemental semiconductor material is composed of a single element (for example, silicon or germanium). The elemental semiconductor material may be in a single crystal state, a polycrystalline state, an amorphous state, or a microcrystalline state (a state having both the single crystal state and the amorphous state, referred to as a microcrystalline state), for example, the silicon may be at least one of single crystal silicon, polycrystalline silicon, amorphous silicon, and microcrystalline silicon.

In some embodiments, the material of the substrate 100 may also be a compound semiconductor material. Common compound semiconductor materials include, but are not limited to, silicon germanium, silicon carbide, gallium arsenide, indium gallium, perovskite, cadmium telluride, copper indium selenium, and the like.

The substrate 100 may also be a sapphire substrate, a silicon-on-insulator substrate, or a germanium-on-insulator substrate.

The substrate 100 may be an N-type semiconductor substrate or a P-type semiconductor substrate. The N-type semiconductor substrate is doped with an N-type doping element, and the N-type doping element may be any one of a group V element such as a phosphorus (P) element, a bismuth (Bi) element, an antimony (Sb) element, or an arsenic (As) element. The P-type semiconductor substrate is doped with a P-type doping element, and the P-type doping element may be any one of a group III element such as a boron (B) element, an aluminum (Al) element, a gallium (Ga) element, or an indium (In) element.

In some embodiments, the solar cell is a single-sided cell, and the first surface 101 of the substrate 100 may be used as a light receiving surface for receiving incident light, and the second surface 102 may be used as a back light surface. In some embodiments, the solar cell is a double-sided cell, and the first surface 101 and the second surface 102 of the substrate 100 may be used as light receiving surfaces for receiving incident light. It should be understood that the back light surface may also receive incident light, but the receiving degree of the back light surface is lower than that of the light receiving surface, and thus the back light surface is defined as a back light surface.

In some embodiments, the second surface 102 of the substrate 100 may be subjected to a texturing process to form a textured surface on the second surface 102 of the substrate 100, so that the absorption and utilization of incident light by the second surface 102 of the substrate 100 can be enhanced. In some embodiments, the textured surface may be a pyramidal textured surface. The pyramidal textured surface, as a common textured surface, can not only reduce the reflectivity of the surface of the substrate 100, but also form a light trap to enhance the absorption of incident light by the substrate 100 and improve the photoelectric conversion efficiency of the solar cell. In some embodiments, the second surface 102 of the substrate 100 may also be a polished surface.

The target doped semiconductor layer 103 is configured to form a doped semiconductor portion through a subsequent patterning process, etc. In the embodiments of the present disclosure, a doping type of the target doped semiconductor layer 103 may be different from a doping type of the substrate 100. For example, the substrate 100 may be doped with a P-type doping element, and the target doped semiconductor layer 103 may be doped with an N-type doping element. For another example, the substrate 100 may be doped with an N-type doping element, and the target doped semiconductor layer 103 may be doped with a P-type doping element. The target doped semiconductor layer 103 is configured to form the doped semiconductor portion through the subsequent patterning process, etc., and the doped semiconductor portion is used as an emitter of the solar cell according to the embodiments of the present disclosure.

In some examples, the target doped semiconductor layer 103 is configured to form a doped semiconductor portion through a subsequent patterning process, a doping type of the target doped semiconductor layer 103 may be the same as a doping type of the substrate 100, and a doping concentration of the target doped semiconductor layer 103 is greater than a doping concentration of the substrate 100. The target doped semiconductor layer 103 is configured to form a high-low junction with the substrate, which enhances the shunting capacity of carriers, reduces the surface recombination of minority carriers, plays a good passivation role, and thus is conducive to efficiency improvement.

The material of the target doped semiconductor layer 103 includes at least one of amorphous silicon, polysilicon, or silicon carbide.

The target doped dielectric layer 104 may have a thickness of 100 nm to 200 nm. For example, the thickness of the target doped dielectric layer 104 may be 100 nm, 107 nm, 132 nm, 158 nm, 178 nm, 183 nm, 198 nm, or 200 nm. In this thickness range, it is ensured that the target doped dielectric layer 104 can provide effective protection for the substrate 100 in the subsequent patterning process, so as to alleviate damage caused by a localized laser irradiation process to the substrate 100.

An operation of forming the target doped semiconductor layer 103 and the target doped dielectric layer 104 may include: providing an initial substrate including a third surface and a fourth surface opposite to the third surface; forming the target doped dielectric layer 104 on the third surface of the initial substrate; and driving a doping element in the target doped dielectric layer 104 into a portion of a thickness of the initial substrate, so that the portion of the initial substrate is converted into the target doped semiconductor layer 103, and the remaining initial substrate is used as the substrate 100.

Process parameters of the operation of driving the doping element in the target doped dielectric layer 104 into the portion of the thickness of the substrate 100 include a process temperature and a process time. The process temperature may be 800° C. to 1200° C., and the process time may be 2 h to 5 h.

A target doping dielectric layer 104 may be formed on each of the third surface and the fourth surface. In the operation of driving the doping element in the target doping dielectric layer 104 into the portion of a thickness of the initial substrate, the initial substrate on which the target doping dielectric layer 104 is formed may be placed into a diffusion furnace, so that a target doping semiconductor layer 103 is formed on each of the third surface and the fourth surface; and then the target doping dielectric layer 104 on the fourth surface needs to be removed by using an acidic solution, and the target doping semiconductor layer 103 on the fourth surface may be removed by using an alkaline solution. The alkaline solution may also play a polishing role on a surface of the substrate 100 exposed after the target doping semiconductor layer 103 is removed, and the polished surface of the substrate 100 is beneficial to improving the quality of a film layer subsequently formed on the surface of the substrate 100.

The acidic solution may be a hydrofluoric acid (HF) solution with a mass percentage of 10% to 70%, and a process time for removing the target doping dielectric layer 104 on the fourth surface may be 50 s to 70 s. The alkaline solution may be a sodium hydroxide (NaOH) solution with a mass percentage of 0.5% to 5%, and process parameters of the operation of removing the target doping semiconductor layer 103 on the fourth surface by using the alkaline solution include a process temperature and a process time, where the process temperature may be 60° C. to 80° C., and the process time may be 100 s to 900 s.

With continued reference to FIG. 1, a first doping layer 105 is formed over the second surface 102, and a second doping layer 106 is formed over the target doping dielectric layer 104. A doping type of the first doping layer 105 is different from a doping type of the target doping semiconductor layer 103.

An operation of forming the first doping layer 105 and the second doping layer 106 may include: forming a first intrinsic semiconductor layer over the second surface 102 and forming a second intrinsic semiconductor layer over the target doping dielectric layer 104; forming a first doping dielectric layer 11 over the first intrinsic semiconductor layer and forming a second doping dielectric layer 10 over the second intrinsic semiconductor layer; driving a doping element in the first doping dielectric layer 11 into the first intrinsic semiconductor layer to form a first doping semiconductor layer 13, and driving a doping element in the second doping dielectric layer 10 into the second intrinsic semiconductor layer to form a second doping semiconductor layer 12. The first doping layer 105 includes the first doping dielectric layer 11 and the first doping semiconductor layer 13, and the second doping layer 106 includes the second doping dielectric layer 10 and the second doping semiconductor layer 12.

The process of forming the first intrinsic semiconductor layer and the second intrinsic semiconductor layer may include a chemical vapor deposition process, an atomic layer deposition process, or a physical vapor deposition process.

The operation of forming the first intrinsic semiconductor layer and the second intrinsic semiconductor layer may include the following process parameters. The process temperature may be 400° C. to 1000° C., and the process time may be 1 h to 4 h.

In some embodiments, at 700° C. to 1000° C., the doping element in the first doping dielectric layer 11 is driven into the first intrinsic semiconductor layer, and the doping element in the second doping dielectric layer 10 is driven into the second intrinsic semiconductor layer. The process time may be 1 h to 3 h.

A thicknesses of each of the first doping semiconductor layer 13 and the second doping semiconductor layer 12 may be 50 nm to 400 nm, in which range, it is ensured that the first doping semiconductor layer 13 can provide effective protection for the substrate 100 in the subsequent patterning process, and the thicker second doping semiconductor layer 12 cam provide a better passivation effect for the substrate 100.

The material of each of the first doping semiconductor layer 13 and the second doping semiconductor layer 12 may include at least one of amorphous silicon, polycrystalline silicon, or silicon carbide.

The material of each of the first doped dielectric layer 11 and the second doped dielectric layer 10 may be silicon glass. For example, each of the first doped semiconductor layer 13 and the second doped semiconductor layer 12 may be doped with phosphorus, and accordingly, the material of each of the first doped dielectric layer 11 and the second doped dielectric layer 10 may be phosphorus silicon glass. For another example, each of the first doped semiconductor layer 13 and the second doped semiconductor layer 12 may be doped with boron, and accordingly, the material of each of the first doped dielectric layer 11 and the second doped dielectric layer 10 may be boron silicon glass.

In the embodiments of the present disclosure, a doping type of the first doped semiconductor layer 13 may be the same as the doping type of the substrate 100, and a concentration of the doping element in the first doped semiconductor layer 13 is greater than a concentration of the doping element in the substrate 100. The first doped semiconductor layer 13 is configured to form a high-low junction with the substrate 100, which enhances the shunting capacity of carriers, reduces the surface recombination of minority carriers, plays a good passivation role, and thus is conducive to efficiency improvement.

In some examples, the doping type of the first doped semiconductor layer 13 may be different from the doping type of the substrate 100, and the first doped semiconductor layer 13 may be used as an emitter of the solar cell manufactured in the embodiments of the present disclosure.

In some embodiments, the solar cell according to the embodiments of the present disclosure may be a TOPCON cell. Before the first doped layer 105 is formed, a tunneling layer 110 is formed on the second surface 102. A thickness of the tunneling layer 110 may be no greater than 2.5 nm. For example, the thickness of the tunneling layer 110 may be 0.5 nm, 0.9 nm, 1.5 nm, 1.8 nm, 2.2 nm, or 2.5 nm.

The material of the tunneling layer 110 may include at least one of silicon oxide, aluminum oxide, silicon nitride, silicon oxynitride, amorphous silicon, or polycrystalline silicon.

Figure 2:
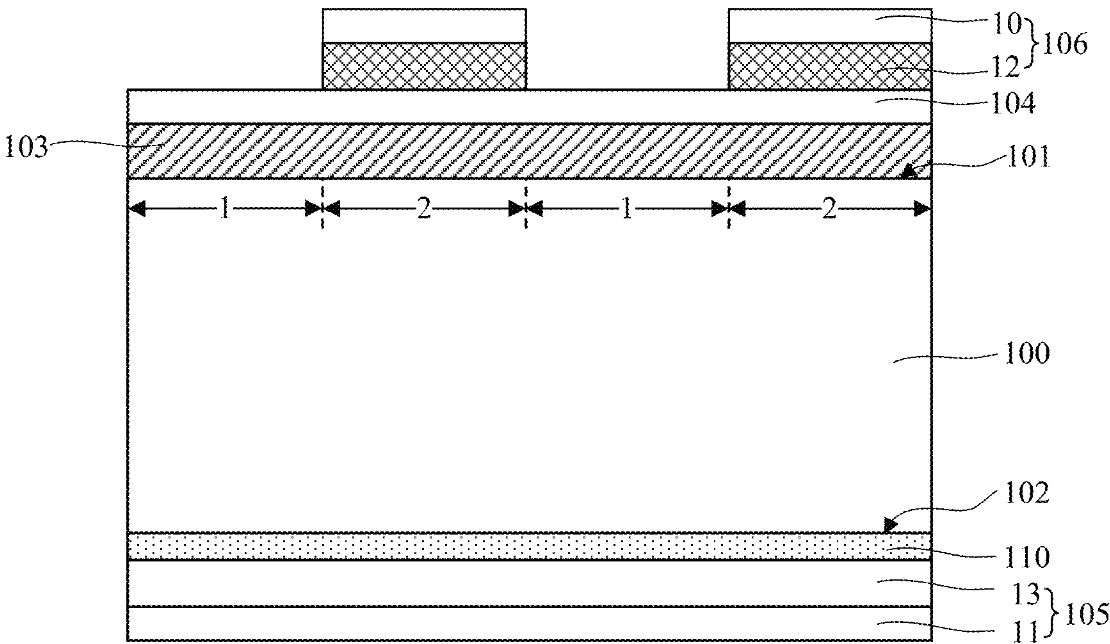
FIG. 2 is a schematic structure diagram corresponding to an operation of performing a patterning process in a method for manufacturing a solar cell according to some embodiments of the present disclosure.

FIG. 2 is a structure diagram corresponding to an operation of performing a patterning process in a method for manufacturing a solar cell according to some embodiments of the present disclosure.

Referring to FIG. 2, a patterning process is performed to remove a portion of the second doped layer 106 over a respective first region 1 of first regions 1 of the first surface to expose a portion of the target doped dielectric layer 104 over the respective first region 1. The first surface 101 includes the first regions 1 and second regions 2 distributed alternatingly. The patterning process includes a localized laser irradiation process.

The patterning process may include: removing a portion of the second doped dielectric layer 10 over the first region 1 and removing a portion of the second doped semiconductor layer 12 over the first region 1 by using the localized laser irradiation process. Since the target doped dielectric layer 104 and the target doped semiconductor layer 103 are arranged between the substrate 100 and the second doped semiconductor layer 12, the target doped dielectric layer 104 and the target doped semiconductor layer 103 can protect the substrate 100 in the operations of the localized laser irradiation process, thereby reducing damage to the substrate 100 caused by the localized laser irradiation process. The remaining portion of the second doped layer 106 over a respective second region 2 of the second regions 2 after the localized laser treatment can be used as a mask in a subsequent etching operation, thereby eliminating the need for an additional operation to form a mask. In addition, the removal of the portions of the second doped dielectric layer 10 and the second doped semiconductor layer 12 over the first region 1 is performed concurrently by using the localized laser irradiation process, thereby reducing the process operations and saving the process cost.

A power of the localized laser irradiation process may be 25 W to 55 W. For example, the power may be 25 W, 33 W, 39 W, 42 W, 48 W, 54 W, or 55 W. In this power range, it is ensured that the portions of the second doped dielectric layer 10 and the second doped semiconductor layer 12 over the first region 1 can be removed.

In some embodiments, after the patterning process, a cleaning process may be performed to remove residual portions of the second doped dielectric layer 10 and the second doped semiconductor layer 12 over the first region 1. A cleaning solution used in the cleaning process may be an acidic solution or an alkaline solution.

The patterning process may include: removing a portion of the second doped dielectric layer 10 over the first region 1 by using a localized laser irradiation process, and after the portion of the second doped dielectric layer 10 over the first region 1 is removed, etching away a portion of the second doped semiconductor layer 12 over the first region 1 with an alkaline solution, so as to remove a portion of the second doped layer 106 over the first region 1. In this way, compared with the technical solution in which the portions of the second doped dielectric layer 10 and the second doped semiconductor layer 12 over the first region 1 are removed by using the localized laser irradiation process, in the technical solution in which only the portion of the second doped dielectric layer 10 over the first region 1 is removed by using the localized laser irradiation process, a shallower laser penetration depth is enabled, and a lower laser is required. The target doped dielectric layer 104, the target doped semiconductor layer 103, and the second doped semiconductor layer 12 can serve as protective layers of the substrate 100 in the localized laser irradiation process, thereby better facilitating reduction of damage to the substrate 100 caused by the localized laser irradiation process. In addition, a high temperature provided by the localized laser irradiation process ablates the portion of the second doped dielectric layer 10 over the first region 1, so as to facilitate removal the portion of the second doped dielectric layer 10 over the first region 1. In the operation of removing the portion of the second doped semiconductor layer 12 over the first region 1, the alkaline solution may also remove the residual portion of the second doped dielectric layer 10 over the first region 1, so that an additional cleaning operation is not required.

A power of the localized laser irradiation process may be 10 W to 40 W. For example, the power may be 10 W, 15 W, 22 W, 29 W, 34 W, 38 W, or 40 W. In this power range, it is ensured that the portion of the second doped dielectric layer 10 over the first region 1 can be removed, and damage to the substrate 100 caused by excessively high power can be avoided.

The alkaline solution may be a sodium hydroxide (NaOH) solution, and the mass percentage of the NaOH solution may be 0.5% to 5%. The process time of the operation of removing the portion of the second doped semiconductor layer 12 over the first region 1 is 400 s to 800 s. For example, the process time may be 400 s, 460 s, 550 s, 673 s, 781 s, or 800 s. Within this process time, it is ensured that the portion of the second doped semiconductor layer 12 over the first region 1 can be completely removed, and the portion of the second doped semiconductor layer 12 over the second region 2 can be prevented from being exposed for too long due to a too long process time, so that the degree of side etching of the portion of the second doped semiconductor layer 12 over the second region 2 is reduced. Thus, high pattern transfer precision of the patterning process is ensured, so that the quality of the formed solar cell is ensured to be good.

In some embodiments, the thickness of the second doped semiconductor layer 12 may be not less than the thickness of the first doped semiconductor layer 13, so that the thickness of the second doped semiconductor layer 12 is ensured to be large. The second doped semiconductor layer 12 is configured to protect the substrate 100 in the patterning process. If in the patterning process, the localized laser irradiation process is adopted to remove the portions of the second doped dielectric layer 10 and the second doped semiconductor layer 12 over the first region 1, the second doped semiconductor layer 12 with a large thickness can reduce the possibility of laser penetration into the substrate 100. If in the patterning process, the localized laser irradiation process is adopted to remove only the portion of the second doped dielectric layer 10 over the first region 1, the second doped semiconductor layer 12 with a large thickness can effectively protect the substrate 100 in the patterning process.

Figure 3:
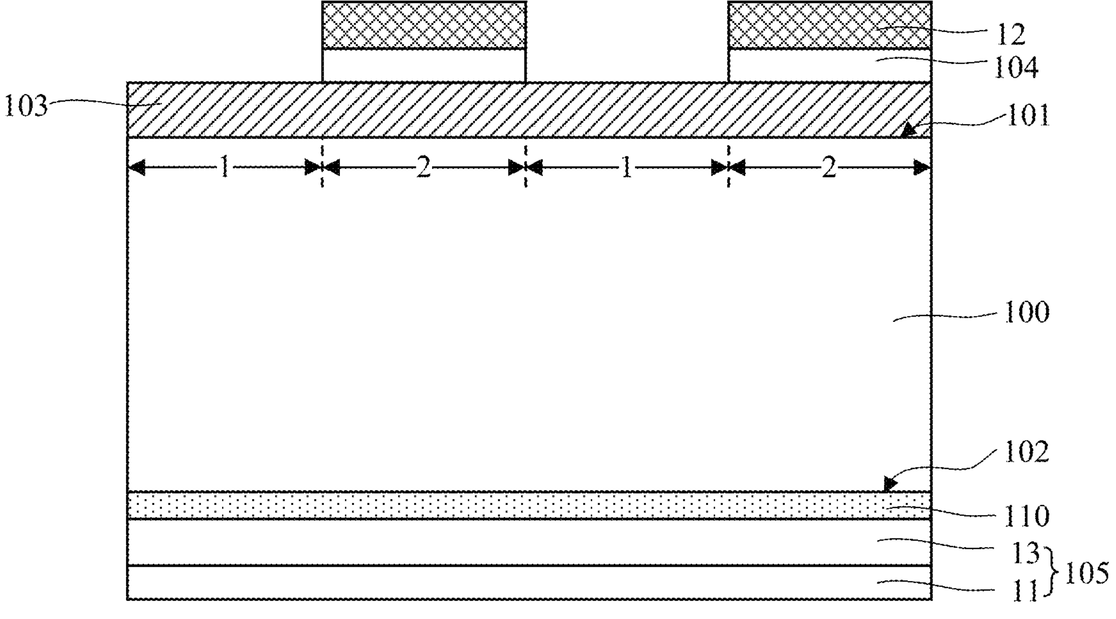
FIG. 3 is a schematic structure diagram corresponding to an operation of etching away a portion of a target doped dielectric layer in a first region in a method for manufacturing a solar cell according to some embodiments of the present disclosure.

FIG. 3 is a structure diagram corresponding to an operation of etching away a portion of the target doped dielectric layer over the first region in a method for manufacturing a solar cell according to some embodiments of the present disclosure.

Referring to FIG. 3, a portion of the target doped dielectric layer 104 over the first region 1 is etched away to expose a portion of the target doped semiconductor layer 103 over the first region 1. The portion of the second doped layer 106 over the second region 2 remaining in the foregoing operation can be used as a mask, and the portion of the target doped dielectric layer 104 over the first region 1 is removed in this operation so that the a remaining film layer over the first region 1 and remaining film layers over the second region 2 form a stepped structure, and film layers over the second region 2 that are not included over the first region 1 can be used as a mask in a subsequent etching operation, thereby eliminating the need for an operation of forming a mask, which facilitates the reduction of process operations and reduces the process cost.

A HF solution with a mass percentage of 10% to 70% may be used to remove the portion of the target doping dielectric layer 104 over the first region 1, and the process time may be 50 s to 70 s.

It can be understood that the target doping dielectric layer 104 is a doping source layer for preparing the target doping semiconductor layer 103, and the second doping dielectric layer 10 is a doping source layer for preparing the second doping semiconductor layer 12. The doping type of the target doping dielectric layer 104 is different from the doping type of the second doping dielectric layer 10, and the material of each of the target doping dielectric layer 104 and the second doping dielectric layer 10 may be silicon glass materials. In some embodiments, since the materials of the target doping dielectric layer 104 and the second doping dielectric layer 10 are the same, the operation of etching away the portion of the target doping dielectric layer 104 over the first region 1 may also be performed concurrently with the operation of etching away the portion of the second doping dielectric layer 10 over the second region 2. In this way, the process operations can be reduced, and the process efficiency can be improved.

Figure 4:
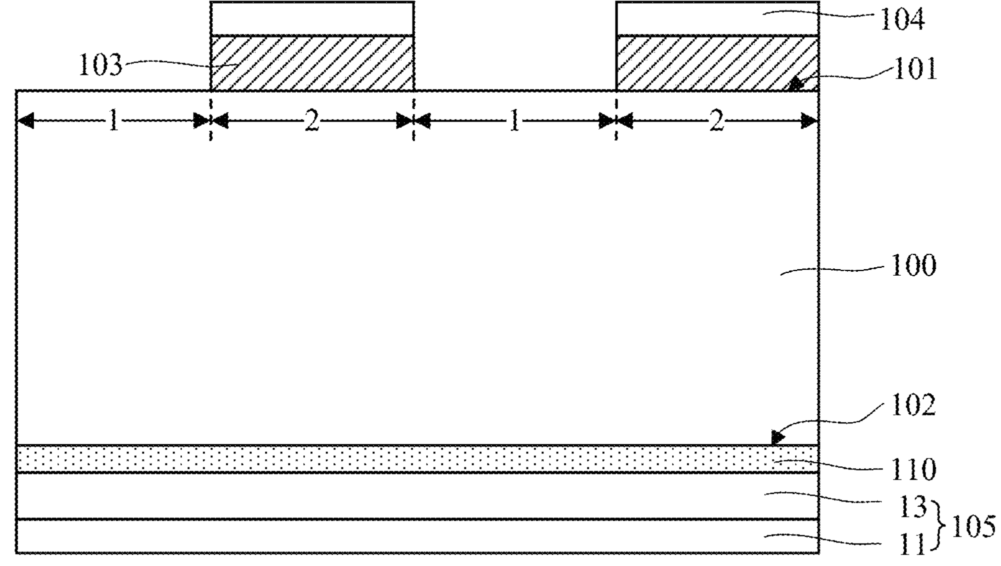
FIG. 4 is a schematic structure diagram corresponding to an operation of etching away a portion of a target doped semiconductor layer over a first region in a method for manufacturing a solar cell according to some embodiments of the present disclosure.

FIG. 4 is a structure diagram corresponding to an operation of etching away a portion of a target doping semiconductor layer over a first region in a method for manufacturing a solar cell according to some embodiments of the present disclosure.

Referring to FIG. 4, a portion of the target doping semiconductor layer 103 over the first region 1 is etched away, and a portion of the second doping layer 106 over the second region 2 is also etched away so that a portion of the target doping dielectric layer 104 over the second region 2 is exposed.

It can be understood that in the foregoing operations, the operation of etching away the portion of the target doping dielectric layer 104 over the first region 1 may also be performed concurrently with the operation of etching away the portion of the second doping dielectric layer 10 over the second region 2, so that the portion of the second doping semiconductor layer 12 is still reserved, and the materials of the target doping semiconductor layer 103 and the second doping semiconductor layer 12 are both semiconductor materials. Since the material of the target doping semiconductor layer 103 may be the same as the material of the second doping semiconductor layer 12, in some embodiments, in the operation of etching away the portion of the target doping semiconductor layer 103 over the first region 1, the operation of etching away the portion of the second doping semiconductor layer 12 over the second region 2 may also be performed concurrently to remove the portion of the second doping layer 106 over the second region 2. In this way, the process operations can be reduced, and the process efficiency can be improved, and meanwhile, in the operations of removing the portions of the target doping semiconductor layer 103 over the first region 1 and the second doping semiconductor layer 12 over the second region 2, the portion of the target doping dielectric layer 104 over the second region 2 can serve as a protective layer of the target doping semiconductor layer 103 over the second region 2.

In some embodiments, a portion of the target doped semiconductor layer 103 over the first region 1 may be etched by using an alkaline solution to remove the portion of the target doped semiconductor layer 103 over the first region 1 and expose the first region 1 of the first surface 101. After the portion of the target doped semiconductor layer 103 over the first region 1 is etched, the first region 1 of the first surface 101 may be textured by using the alkaline solution.

In this way, the portion of the target doped semiconductor layer 103 over the first region 1 can be completely removed by concurrently performing the etching of the portion of the target doped semiconductor layer 103 over the first region 1 and the texturing of the first region 1 of the first surface 101, and meanwhile, the textured structure of the first region 1 can enhance the absorption and utilization rate of the incident light.

The textured surface may be composed of a plurality of pyramid structures, and a height of each pyramid structure along a thickness direction of the substrate 100 may be 1 μm to 10 μm.

The operation of etching away the portion of the target doped semiconductor layer 103 over the first region 1 may include the following process parameters. The alkaline solution includes an NaOH solution, the mass percentage of the NaOH solution is 0.5% to 5%, and the process temperature is 60° C. to 80° C., for example, 60° C., 65° C., 71° C., 76° C., 79.5° C. or 80° C. In this temperature range, the etching of the target doped semiconductor layer 103 by the alkaline solution can be accelerated, thereby improving the process efficiency. The process time is 100 s to 1000 s, for example, 100 s, 321 s, 534 s, 686 s, 782 s, 856 s, 988 s or 1000 s. In this process time range, it is ensured that the portion of the target doped semiconductor layer 103 over the first region 1 can be completely removed, and a sidewall of the portion of the target doped semiconductor layer 103 over the second region 2 can be prevented from being exposed for too long, so as to reduce the degree of side etching of the portion of the target doped semiconductor layer 103 over the second region 2.

Figure 5:
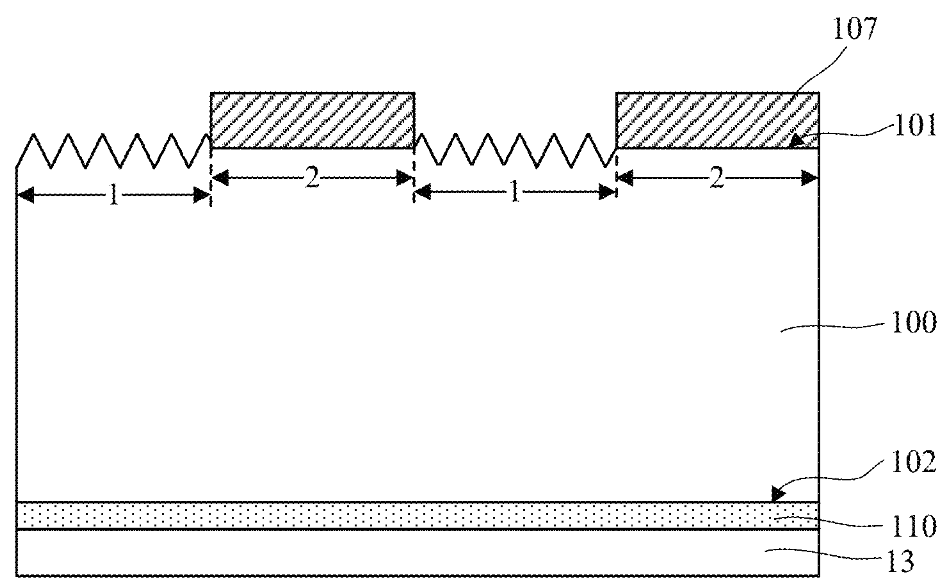
FIG. 5 is a schematic structure diagram corresponding to an operation of etching away a portion of a target doped dielectric layer in a second region in a method for manufacturing a solar cell according to some embodiments of the present disclosure.

FIG. 5 is a schematic structure diagram corresponding to an operation of etching away a portion of a target doped dielectric layer over the second region in a method for manufacturing a solar cell according to some embodiments of the present disclosure.

Referring to FIG. 5, the portion of the target doped dielectric layer 104 over the second region 2 is etched away, and a portion of the target doped semiconductor layer 103 over the second region 2 is reserved as the doped semiconductor portion 107.

The portion of the target doped dielectric layer 104 over the second region 2 may be etched away by using an acidic solution.

The operation of etching away the portion of the target doped dielectric layer 104 over the second region 2 may include the following process parameters. The acidic solution includes an HF solution, the mass percentage of the HF solution may be 10% to 70%, and the process time may be 50 s to 70 s.

In some embodiments, after the portion of the target doped dielectric layer 104 over the second region 2 is etched away, a film layer over the second region 2 may be further etched to ensure that the target doped dielectric layer 104 is completely removed, and a portion of the substrate 100 damaged by the laser in the aforementioned patterning process can be removed.

It can be understood that the target doped dielectric layer 104 serves as a doping source layer of the target doped semiconductor layer 103, the first doped dielectric layer 11 serves as a doping source layer of the first doped semiconductor layer 13, and the materials of the target doped dielectric layer 104 and the first doped dielectric layer 11 may both be silicon glass. Since the material of the target doped dielectric layer 104 is the same as the material of the first doped dielectric layer 11, in some embodiments, the first doped dielectric layer 11 is concurrently etched away in the operation of etching away the portion of the target doped dielectric layer 104 over the second region 2. In this way, in the multiple etching operations after the aforementioned patterning process, the first doped dielectric layer 11 can play a protective role on the first doped semiconductor layer 13 by not being removed, so that the first doped semiconductor layer 13 is prevented from being eroded by the acidic solution or the alkaline solution, thereby ensuring that the solar cell has good performance. The removal of the first doped dielectric layer 11 is concurrently performed in the operation of etching away the portion of the target doped dielectric layer 104 over the second region 2, so that the process operations can be reduced and the processing efficiency can be improved.

Figure 6:
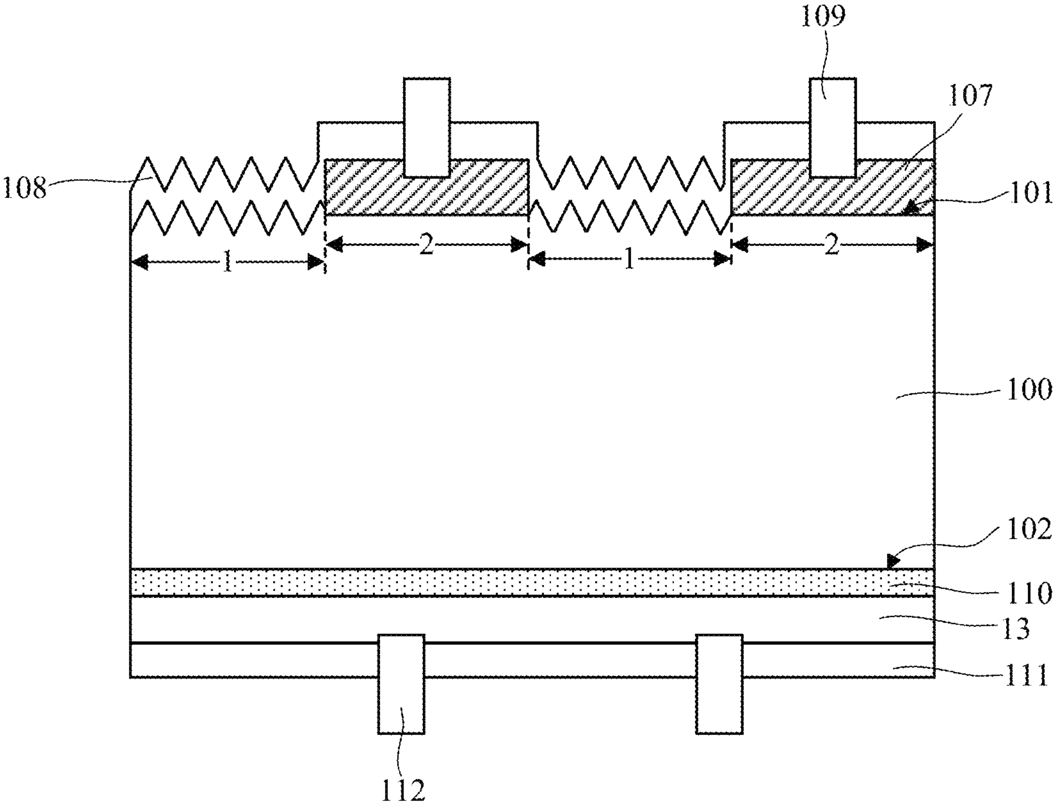
FIG. 6 is a schematic structure diagram corresponding to an operation of forming a first passivation layer in a method for manufacturing a solar cell according to some embodiments of the present disclosure.

FIG. 6 is a schematic structure diagram corresponding to an operation of forming a first passivation layer in a method for manufacturing a solar cell according to some embodiments of the present disclosure.

Referring to FIG. 6, the method may further include: forming a first passivation layer 108, the first passivation layer 108 being located on a surface of the doped semiconductor portion 107 away from the substrate 100 and over the first region 1 of the substrate 100; and forming a first electrode 109, the first passivation layer 108 being in electrical contact with the doped semiconductor portion 107. For example, the first passivation layer 108 penetrates through the first passivation layer 108 to be in electrical contact with the doped semiconductor portion 107.

A material of the first electrode 109 may be metal, for example, copper, silver, nickel, or aluminum. In some embodiments, the process of forming the first electrode 109 may include: screen-printing a metal paste onto a selected region of the first passivation layer 108.

A material of the first passivation layer 108 may be at least one of silicon oxide, aluminum oxide, silicon nitride, or silicon oxynitride. The process of forming the first passivation layer 108 may include a chemical vapor deposition process, an atomic layer deposition process, or a physical vapor deposition process.

In some embodiments, the method further includes: forming a second passivation layer 111 on the first doped semiconductor layer 13; and forming a second electrode 112 penetrating through the second passivation layer 111 to be in electrical contact with the first doped semiconductor layer 13.

The process of forming the second passivation layer 111 may be the same as the process of forming the first passivation layer 108, and may be referred to the description of the method of forming the first passivation layer 108. The process of forming the second electrode 112 may be the same as the process of forming the first electrode 109, and may be referred to the description of the process of forming the first electrode 109.

Correspondingly, other embodiments of the present disclosure also provide a method for manufacturing a solar cell. The method for manufacturing the solar cell provided by the other embodiments of the present disclosure is described in detail below in conjunction with the drawings. The same or corresponding parts of the other embodiments are the same as or corresponding to the description of the foregoing embodiments, and are not described in detail below.

Figure 7:
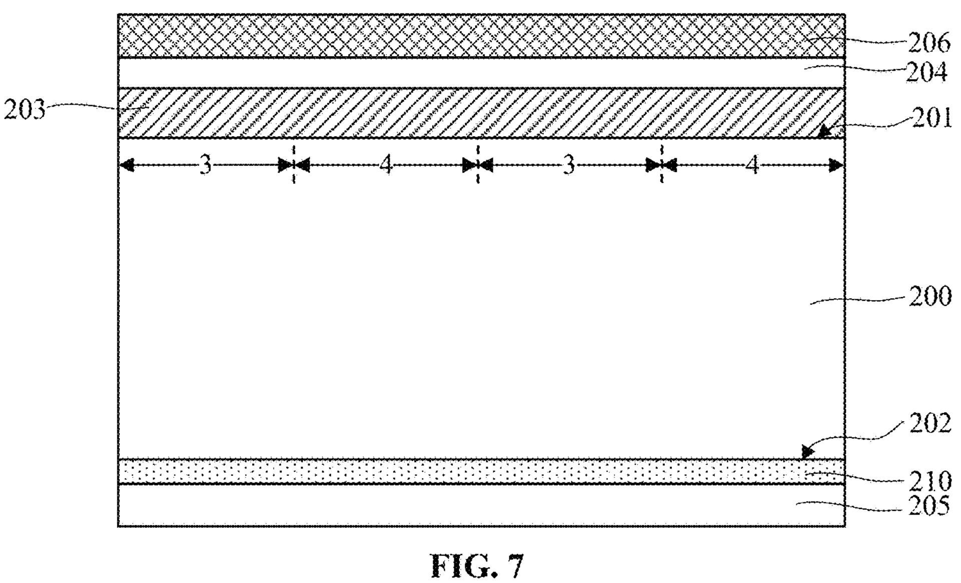
FIG. 7 is a schematic structure diagram corresponding to an operation of providing a substrate in another method for manufacturing a solar cell according to other embodiments of the present disclosure.

FIG. 7 to FIG. 12 are schematic structure diagrams illustrating a solar cell according to some embodiments of the present disclosure. FIG. 7 is a schematic structure diagram corresponding to an operation of providing a substrate in a method for manufacturing a solar cell according to the other embodiments of the present disclosure.

Referring to FIG. 7, a substrate 200 is provided. The substrate 200 has a first surface 201 and a second surface 202 opposite to the first surface 201. The first surface 201 includes first regions 1 and second regions 2 distributed alternatingly, a target doped semiconductor layer 203 is formed on the first surface 201, and a target doped dielectric layer 204 is formed on a surface of the target doped semiconductor layer 203 away from the first surface 101. The target doped semiconductor layer 203 is configured to form a doped semiconductor portion through a subsequent patterning process.

Specific arrangements of the substrate 200, the target doped semiconductor layer 203, and the target doped dielectric layer 204 according to the embodiments of the present disclosure may be referred to the foregoing embodiments, and are not described in detail below.

In some embodiments, a doping type of the target doped semiconductor layer 203 may be different from a doping type of the substrate 200. For example, the substrate 200 may be doped with a P-type doping element, and the target doped semiconductor layer 203 may be doped with an N-type doping element. For another example, the substrate 200 may be doped with an N-type doping element, and the target doped semiconductor layer 203 may be doped with a P-type doping element. The target doped semiconductor layer 203 is configured to form the doped semiconductor portion through the subsequent patterning process, and the doped semiconductor portion is used as an emitter of the solar cell according to the embodiments of the present disclosure.

In some embodiments, the doping type of the target doped semiconductor layer 203 may be the same as the doping type of the substrate 200, and a doping concentration of the target doped semiconductor layer 203 is higher than a doping concentration of the substrate 200. The target doped semiconductor layer 203 is configured to form a high-low junction with the substrate 200, which enhances the shunting capacity of carriers, reduces the surface recombination of minority carriers, plays a good passivation role, and thus is conducive to efficiency improvement The target doped dielectric layer 204 may have a thickness of 100 nm to 200 nm. For example, the thickness of the target doped dielectric layer 204 may be 100 nm, 107 nm, 132 nm, 158 nm, 178 nm, 183 nm, 198 nm or 200 nm. In this thickness range, the target doped dielectric layer 204 can effectively protect the substrate 200 in the subsequent patterning process, thereby reducing the damage caused by the localized laser irradiation process to the substrate 200.

Referring to FIG. 7, a first doping layer 205 is formed on the second surface 202, and a second doping layer 206 is concurrently formed on the target doped dielectric layer 204. The doping type of the first doping layer 205 is different from the doping type of the target doped semiconductor layer 203.

In some embodiments, the doping type of the first doping layer 205 may be the same as the doping type of the substrate 200. In some embodiments, the doping type of the first doping layer 205 may be different from the doping type of the substrate 200.

The second doping layer 206 is a semiconductor material layer doped with a first doping element. After a portion of the target doped dielectric layer 204 over the first region 3 is etched away, a portion of the target doped semiconductor layer 203 over the first region 3 and a portion of the second doping layer 206 over the second region 4 are concurrently etched away.

The second doping layer 206 and the first doping layer 205 may be formed by in-situ doping, thermal diffusion, or ion implantation. Therefore, in the method for preparing the first doping layer 205 and the second doping layer 206 according to the embodiments of the present disclosure, form doping source layers for preparing the first doping layer 205 and the second doping layer 206 is not needed, thereby eliminating the need for an operation of removing the doping source layers, which facilitate the reduction of process operations, and reduce process cost.

For example, the first doping layer 205 and the second doping layer 206 may be made of amorphous silicon, and boron is doped in each of the first doping layer 205 and the second doping layer 206. A mixed gas of silane and a doping source may be introduced into a vacuum furnace tube to prepare the first doping layer 205 and the second doping layer 206. The doping source may include BBr3, BCl3, or B2H6.

In some embodiments, the solar cell according to the embodiments of the present disclosure may be a TOPCON cell. Before the first doping layer 205 is formed, a tunneling layer 210 is formed on the second surface 202. A thickness of the tunneling layer 210 may be no greater than 2.5 nm, for example, 0.5 nm, 0.9 nm, 1.5 nm, 1.8 nm, 2.2 nm, or 2.5 nm.

Figure 8:
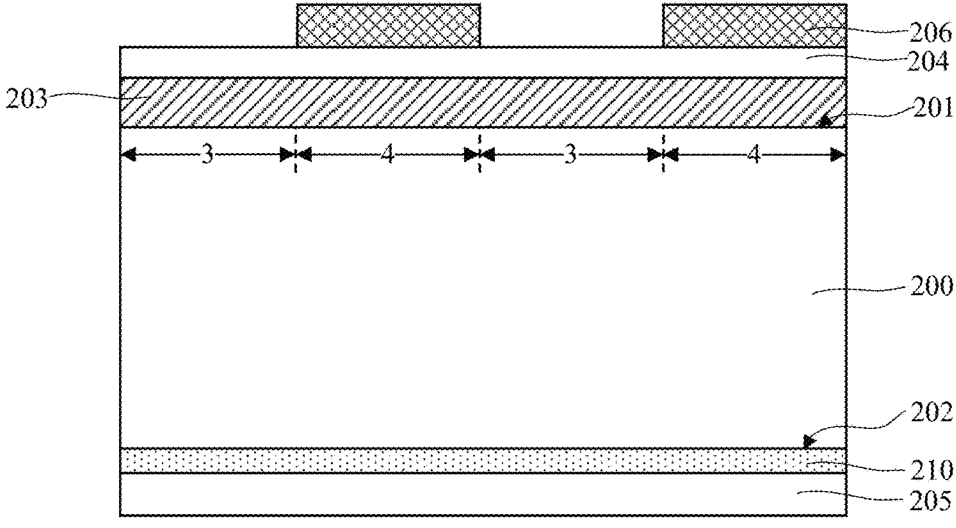
FIG. 8 is a schematic structure diagram corresponding to an operation of performing a patterning process in another method for manufacturing a solar cell according to other embodiments of the present disclosure.

FIG. 8 is a schematic structure diagram corresponding to an operation of performing a patterning process in a method for manufacturing another solar cell according to other embodiments of the present disclosure.

Referring to FIG. 8, a patterning process is performed to remove a portion of the second doping layer 206 over the first region 3 and expose a portion of the target doping dielectric layer 204 over the first region 3. The patterning process includes a localized laser irradiation process.

Since the second doping layer 206 is formed on the target doping dielectric layer 204 in the foregoing operation, the second doping layer 206 and the target doping dielectric layer 204 as a whole have a relatively large thickness in the patterning process, and can serve as a protective layer of the portion of the target doping semiconductor layer 203 over the second region 4. In the patterning process, processing the second doping layer 206 not only forms a mask (i.e., the remaining portion of the second doping layer 206 over the second region 4 after the localized laser irradiation process) for a subsequent etching operation, thereby eliminating additional mask formation operations, but also avoids direct processing of the target doped dielectric layer 204 or the target doped semiconductor layer 203 in the first region 3 over the first region 3 via the localized laser irradiation process. In the patterning process, the portions of the target doping dielectric layer 204 and the target doping semiconductor layer 203 over the second region 4 can serve as protective layers of the substrate 200, thereby reducing laser damage to the substrate 200.

A power of the localized laser irradiation process may be 10 W to 40 W. For example, the power may be 10 W, 17 W, 23 W, 29 W, 34 W, 38 W, or 40 W. In this power range, the portion of the second doping dielectric layer over the first region 3 can be removed, and damage to the substrate 200 caused by excessively large power can be avoided.

In some embodiments, after the patterning process, a cleaning process may be performed to remove a residual portion of the second doping layer 206 over the first region 3. The cleaning solution used in the cleaning process may be an acidic solution or an alkaline solution.

Figure 9:
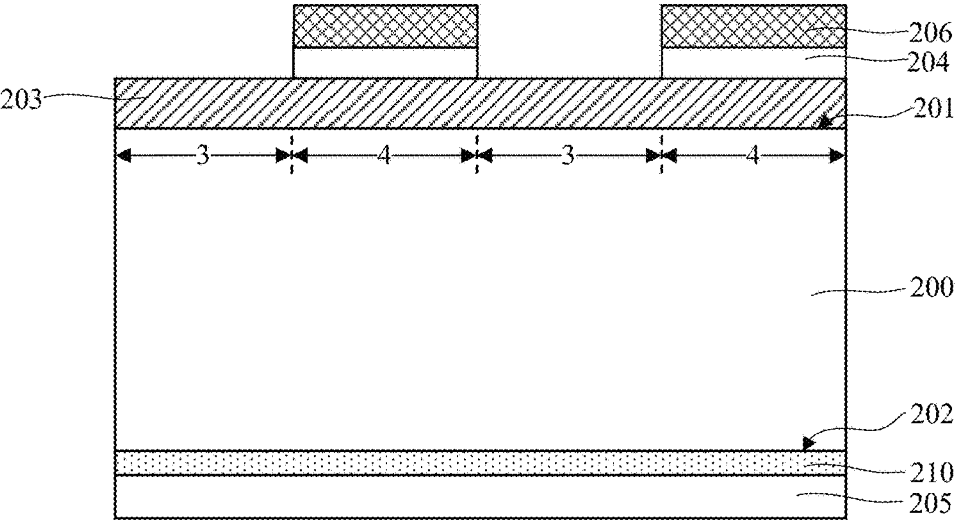
FIG. 9 is a schematic structure diagram corresponding to an operation of etching away a portion of a target doped dielectric layer over a first region in another method for manufacturing a solar cell according to other embodiments of the present disclosure.

FIG. 9 is a schematic structure diagram of an operation of etching away a portion of a target doping dielectric layer over a first region in a method for manufacturing a solar cell according to other embodiments of the present disclosure.

Referring to FIG. 9, a portion of the target doping dielectric layer 204 over the first region 3 is etched away to expose a portion of the target doping semiconductor layer 203 over the first region 3. The portion of the second doping layer 206 over the second region 4 retained in the foregoing operation can serve as a mask. In this operation, after the portion of the target doping dielectric layer 204 over the first region 3 is removed, the remaining film layer over the first region 3 and the remaining film layers over the second region 4 form a stepped structure. Film layers over the second region 4 that are not included over the first region 3 can be used as a mask in a subsequent etching operation, thereby eliminating the need for an operation of forming a mask, which facilitates the reduction of process operations and reduces the process cost.

The HF solution with a mass percentage of 10% to 70% may be used to remove the portion of the target doped dielectric layer 204 over the first region 3, and the process time may be 50 s to 70 s.

Figures 10, 11:
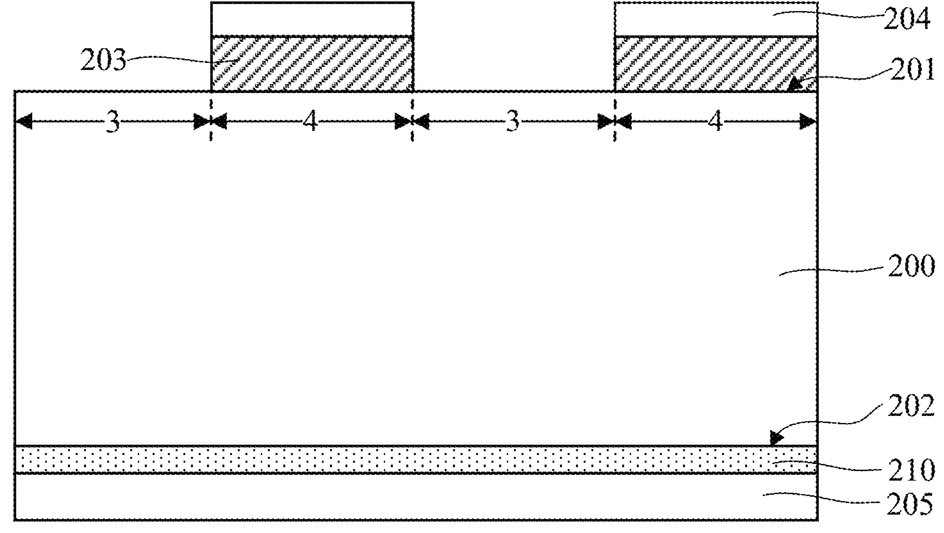
FIG. 10 is a schematic structure diagram corresponding to an operation of etching away a portion of a target doped semiconductor layer over a first region in another method for manufacturing a solar cell according to other embodiments of the present disclosure.
FIG. 11 is a schematic structure diagram corresponding to an operation of etching away a portion of a target doped dielectric layer over a second region in another method for manufacturing a solar cell according to other embodiments of the present disclosure.

FIG. 10 is a schematic structure diagram corresponding to an operation of etching away a portion of a target doped semiconductor layer over a first region in a method for manufacturing a solar cell according to other embodiments of the present disclosure.

Referring to FIG. 10, a portion of the target doped semiconductor layer 203 over the first region 3 is etched away, and a portion of the second doped layer 206 over the second region 4 is also etched away to expose a portion of the target doped dielectric layer 204 over the second region 4.

In some embodiments, the portion of the target doped semiconductor layer 203 over the first region 3 may be etched away by using an alkaline solution to expose the first region 3 of the first surface 201. After the portion of the target doped semiconductor layer 203 over the first region 3 is etched away, the first region 3 of the first surface 201 may be textured by using the alkaline solution.

In this way, by concurrently performing the etching of the portion of the target doped semiconductor layer 203 over the first region 3 and the texturing of the portion of the first surface 201 over the first region 3, it is ensured that the portion of the target doped semiconductor layer 203 over the first region 3 can be completely removed, and meanwhile, the textured structure of the first region 3 can enhance the absorption and utilization rate of the incident light.

The operation of etching away the portion of the target doped semiconductor layer 203 over the first region 3 may include the following process parameters. The alkaline solution includes an NaOH solution, the mass percentage of the NaOH solution is 0.5% to 5%; the process temperature is 60 to 80° C., for example, 60° C., 65° C., 71° C., 76° C., 79.5° C. or 80° C. In this temperature range, the etching of the target doped semiconductor layer 203 by the alkaline solution is accelerated, thereby improving the process efficiency. The process time is 200 s to 2000 s, for example, 200 s, 321 s, 534 s, 686 s, 782 s, 856 s, 988 s or 2000 s. in this process time range, the portion of the target doped semiconductor layer 203 over the first region 3 can be completely removed, and a sidewall of the portion of the target doped semiconductor layer 203 over the second region 4 can be prevented from being exposed for too long so as to reduce the side etching of the portion of the target doped semiconductor layer 203 over the second region 4 by the alkaline solution.

Since the materials of the target doped semiconductor layer 203 and the second doped layer 206 are both semiconductor materials. In some embodiments, in the operation of etching away the portion of the target doped semiconductor layer 203 over the first region 3, the portion of the second doped semiconductor layer 206 over the second region 4 may also be etched away concurrently. In this way, the process operations can be reduced, thereby improving the process efficiency, and meanwhile, in the operation of removing away the portion of the target doped semiconductor layer 203 over the first region 3 and the portion of the second doped layer 206 over the second region 4, the portion of the target doped dielectric layer 204 over the second region 4 can serve as a protective layer of the portion of the target doped semiconductor layer 203 over the second region 4.

FIG. 11 is a schematic structure diagram corresponding to an operation of etching away a portion of the target doped dielectric layer 204 over the second region 4 in a method for manufacturing a solar cell according to other embodiments of the present disclosure.

Referring to FIG. 11, the portion of the target doped dielectric layer 204 over the second region 4 is etched away, and the portion of the target doped semiconductor layer 203 over the second region 4 is reserved as a doped semiconductor portion 207.

The portion of the target doped dielectric layer 204 over the second region 4 may be etched away by using an acidic solution.

The operation of etching away the portion of the target doped dielectric layer 204 over the second region 4 may include the following process parameters. The acidic solution includes an HF solution, the mass percentage of the HF solution may be 10% to 70%, and the process time may be 50 s to 70 s.

In some embodiments, after the portion of the target doped dielectric layer 204 over the second region 4 is etched away, a film layer over the second region 4 may be further etched to ensure that the target doped dielectric layer 204 is completely removed, and the portion of the substrate 200 damaged by the laser in the aforementioned patterning process can be removed.

Figure 12:
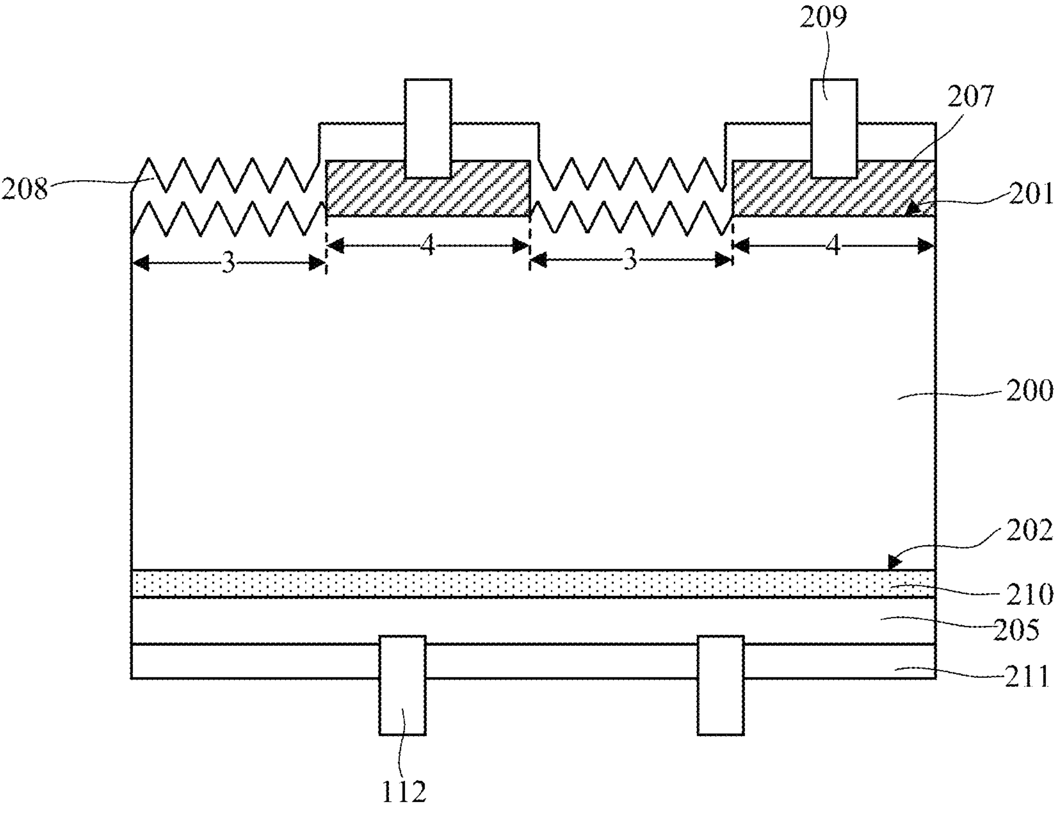
FIG. 12 is a schematic structure diagram corresponding to an operation of forming a first passivation layer in a method for manufacturing a solar cell according to some embodiments of the present disclosure.

FIG. 12 is a schematic structure diagram corresponding to an operation of forming a first passivation layer in a method for manufacturing a solar cell according to some embodiments of the present disclosure.

Referring to FIG. 12, the method may further include: forming a first passivation layer 208, the first passivation layer 208 being located on a surface of the doped semiconductor portion 207 away from the substrate 200 and over the first region 3 of the substrate 200; and forming a first electrode 209 penetrating through the first passivation layer 208 to be in electrical contact with the doped semiconductor portion 207.

In some embodiments, the method may further include: forming a second passivation layer 211 on the first doped layer 205; and forming a second electrode 212 penetrating through the second passivation layer 211 to be in electrical contact with the first doped layer 205.

The preparation processes and materials of the first passivation layer and the second passivation layer may be referred to the foregoing embodiments, and the preparation processes and materials of the first electrode and the second electrode may be referred to the foregoing embodiments, which are not described in detail here.

A person of ordinary skill in the art shall understand that the above embodiments are merely specific and exemplary embodiments for practicing the present disclosure, and in practice, various modifications may be made to these embodiments in terms of formality and detail, without departing from the spirit and scope of the present disclosure. Various variations and modifications may be made by one skilled in the art without departing from the spirit and scope of the present disclosure. Accordingly, the protection scope of the present disclosure is subject to the appended claims.

What is claimed is:

1. A method for manufacturing a solar cell, comprising:

providing a substrate having a first surface and a second surface opposite to the first surface, wherein a target doped semiconductor layer is formed on the first surface, and a target doped dielectric layer is formed on a surface of the target doped semiconductor layer away from the first surface;

forming concurrently a first doped layer on the second surface and a second doped layer on a side of the target doped dielectric layer away from the target doped semiconductor layer, wherein the first doped layer has a doping type different from a doping type of the target doped semiconductor layer;

patterning the second doped layer, including removing portions of the second doped layer covering portions of the target doped dielectric layer over respective first regions of the first surface, wherein patterning the second doped layer includes localized laser irradiation;

etching away the portions of the target doped dielectric layer over the respective first regions to expose portions of the target doped semiconductor layer over the respective first regions;

etching away the portions of the target doped semiconductor layer over the respective first regions, and etching away portions of the second doped layer over respective second regions of the first surface to expose portions of the target doped dielectric layer over the respective second regions, wherein the respective first regions and the respective second regions are alternatingly distributed; and etching away the portions of the target doped dielectric layer over the respective second regions, leaving portions of the target doped semiconductor layer over the respective second regions to serve as doped semiconductor portions for the solar cell.

2. The method according to claim 1, wherein forming the first doped layer and the second doped layer include:

forming concurrently a first intrinsic semiconductor layer on the second surface and a second intrinsic semiconductor layer on the side of the target doped dielectric layer away from the target doped semiconductor layer;

forming concurrently a first doped dielectric layer on a side of the first intrinsic semiconductor layer away from the substrate and a second doped dielectric layer on a side of the second intrinsic semiconductor layer away from the target doped dielectric layer; and driving a dopant element in the first doped dielectric layer into the first intrinsic semiconductor layer to form a first doped semiconductor layer, and driving a dopant element in the second doped dielectric layer into the second intrinsic semiconductor layer to form a second doped semiconductor layer, wherein the first doped layer includes the first doped dielectric layer and the first doped semiconductor layer, and the second doped layer includes the second doped dielectric layer and the second doped semiconductor layer;

wherein in etching away the portions of the target doped dielectric layer over the respective second regions, the first doped dielectric layer is etched away concurrently.

3. The method according to claim 2, wherein patterning the second doped layer includes:

removing portions of the second doped dielectric layer over the respective first regions and portions of the second doped semiconductor layer over the respective first regions by the localized laser irradiation.

4. The method according to claim 3, wherein the localized laser irradiation has a power of 25 W to 55 W.

5. The method according to claim 2, wherein patterning the second doped layer includes:

removing portions of the second doped dielectric layer over the respective first regions by the localized laser irradiation; and etching away portions of the second doped semiconductor layer over the respective first regions by an alkaline solution after removing the portions of the second doped dielectric layer.

6. The method according to claim 5, wherein the localized laser irradiation has a power of 10 W to 40 W.

7. The method according to claim 5, wherein the alkaline solution is a sodium hydroxide (NaOH) with a mass percentage of 0.5% to 5%, and a process time for removing the portions of the second doped semiconductor layer over the respective first regions is 400 s to 800 s.

8. The method according to claim 2, wherein the second doped semiconductor layer has a thickness not less than a thickness of the first doped semiconductor layer.

9. The method according to claim 2, wherein in etching away the portions of the target doped dielectric layer over the respective first regions, portions of the second doped dielectric layer over the respective second regions are concurrently etched away;

after the portions of the target doped dielectric layer over the respective first regions are etched away, the portions of the target doped semiconductor layer over the respective first regions are etched away, and portions of the second doped semiconductor layer over the respective second regions are concurrently etched away to remove the portions of the second doped layer over the respective second regions.

10. The method according to claim 1, wherein the portions of the target doped semiconductor layer over the respective first regions are etched away by an alkaline solution to expose the respective first regions of the first surface; and wherein after the portions of the target doped semiconductor layer over the respective first regions are etched away, texturing the respective first regions of the first surface are performed by using the alkaline solution.

11. The method according to claim 10, wherein process parameters of etching away the portions of the target doped semiconductor layer over the respective first regions includes:

the alkaline solution including a sodium hydroxide (NaOH) solution with a mass percentage of 0.5% to 5%, a process temperature being 60° C. to 80° C., and a process time being 100 s to 1000 s.

12. The method according to claim 1, wherein the portions of the target doped dielectric layer over the respective second regions are etched away by using an acidic solution; and wherein process parameters of etching away the portions of the target doped dielectric layer over the respective second regions include: the acidic solution including a hydrofluoric acid (HF) solution with a mass percentage of 10% to 70%, and a process time being 50 s to 70 S.

13. The method according to claim 1, wherein the second doped layer is a semiconductor material layer doped with a first doping element;

after the portions of the target doped dielectric layer over the respective first regions are etched away, the portions of the target doped semiconductor layer over the respective first regions and the portions of the second doped layer over the respective second regions are concurrently etched away.

14. The method according to claim 1, wherein the target doped dielectric layer has a thickness of 100 nm to 200 nm.

15. The method according to claim 1, further comprising:

forming a first passivation layer, wherein the first passivation layer is located on surfaces of the doped semiconductor portions away from the substrate and over the respective second regions of the first surface; and forming first electrodes, wherein the first electrodes are in electrical contact with the doped semiconductor portions respectively.

16. The method according to claim 1, wherein a tunneling layer is formed on the second surface before the first doped layer is formed, and the tunneling layer has a thickness of no more than 2.5 nm.

17. The method according to claim 1, wherein the target doped semiconductor layer has a doping type different from a doping type of the substrate.

18. The method according to claim 1, wherein the target doped semiconductor layer has a doping type same as a doping type of the substrate, and a doping concentration greater than a doping concentration of the substrate.

19. The method according to claim 1, wherein forming the target doped semiconductor layer and the target doped dielectric layer includes:

providing an initial substrate including a third surface;

forming the target doped dielectric layer on the third surface of the initial substrate; and driving a doping element in the target doped dielectric layer into a portion of a thickness of the initial substrate, wherein the portion of the thickness of the initial substrate is converted into the target doped semiconductor layer, and the remaining portion of initial substrate is used as the substrate.

20. The method according to claim 19, wherein process parameters of driving the doping element in the target doped dielectric layer into the portion of the thickness of the substrate include: a process temperature being 800° C. to 1200° C., and a process time being 2 h to 5 h.

* * * * *